United States Patent [19]

Maier, Jr.

[11] 4,148,050
[45] Apr. 3, 1979

[54] RADIATION DOSE RATE HARDENED LIGHT DETECTOR

[75] Inventor: Roe J. Maier, Jr., Bosque Farms, N. Mex.

[73] Assignee: The United States of America as represented by the Secretary of the Air Force, Washington, D.C.

[21] Appl. No.: 866,432

[22] Filed: Jan. 3, 1978

[51] Int. Cl.² .................................. H01L 27/14
[52] U.S. Cl. ............................ 357/30; 357/15; 357/4; 250/211 J
[58] Field of Search .................. 357/30, 15, 4; 250/211 J

[56] References Cited

U.S. PATENT DOCUMENTS

| 3,393,088 | 7/1968 | Manasevit | 117/106 |
| 3,704,376 | 11/1972 | Lehovec | 250/211 J |
| 3,971,057 | 7/1976 | Connors | 357/30 |

OTHER PUBLICATIONS

Anderson et al., Solid State Electronics, 1976, vol. 19, pp. 973-974.

Primary Examiner—Martin H. Edlow
Attorney, Agent, or Firm—Joseph E. Rusz; George Fine

[57] ABSTRACT

A radiation dose rate hardened light detector uses a Schottky diode island on a sapphire substrate. The thickness of the silicon is carefully adjusted to produce interference absorption at the light wavelength of interest. The light enters the silicon through the sapphire and is reflected off a metal electrode to produce the interference at the silicon-sapphire interface.

4 Claims, 1 Drawing Figure

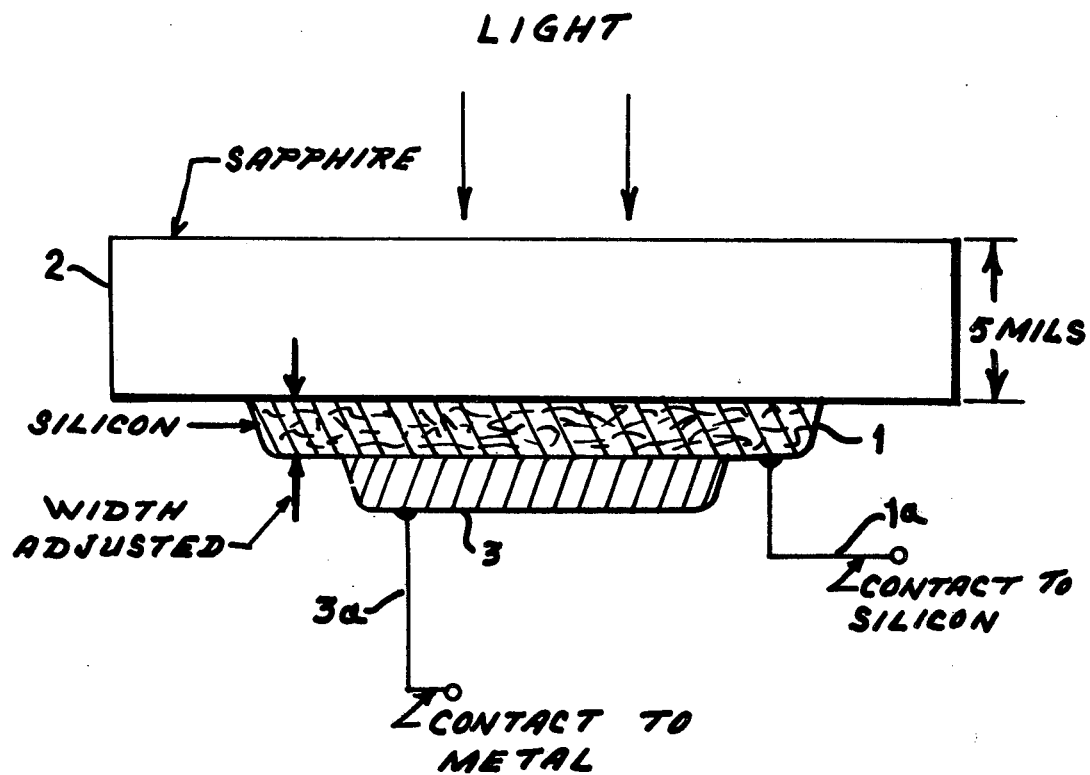

RADIATION DOSE RATE HARDENED LIGHT DETECTOR

STATEMENT OF GOVERNMENT INTEREST

The invention described herein may be manufactured and used by or for the Government for governmental purposes without the payment of any royalty thereon.

BACKGROUND OF THE INVENTION

Electro-optical systems of the type in which the detector of this invention will be used are used in data transmission, communications and other systems. Extensive activity is underway for developing fiber-optic links where this type of detector will be used. Military systems, including satellites, aeronautical and missiles, are developing similar uses requiring devices which will operate in a nuclear radiation environment.

One of the purposes of this invention is to enhance the sensitivity of the detector to light without increasing the sensitivity to gamma and x-ray radiation. This will improve the signal to noise ratio in a radiation environment.

SUMMARY OF THE INVENTION

A radiation dose rate hardened light detector is provided. The thickness of a Schottky diode silicon island on a sapphire substrate is carefully adjusted to produce interference removal absorption at a desired wavelength. The diode can be tuned to be insensitive to light at other than a desired wavelength. The absorption is produced by causing the light to reflect back and forth in the silicon causing the absorbtion to occur in a small region.

DESCRIPTION OF THE DRAWING

The single FIGURE shows a preferred embodiment of the radiation dose rate hardened light detector.

DESCRIPTION OF THE PREFERRED EMBODIMENT

Now referring in detail to the single figure, there is shown silicon island 1 with electrical contact 1a. Silicon island 1 can be N or P type. On one side of silicon island 1 there is positioned a sapphire substrate 2 in the region of 5 to 10 mils in thickness. On the other side of silicon island 1, there is positioned a metal electrode 3 having metal contact 3a. A suitable metal is chosen so that the metal electrode will form a Schottky diode on the silicon island. The choice is controlled by the type of silicon used in the island. N type requires a different metal than does P type. The silicon thickness is tuned to the light wavelength by an oxidizing etching process until absorption is observed. The light detector is a Schottky diode made on a silicon island. The thickness of the silicon may be in the region of 0.5–0.7u meters. The thickness is carefully adjusted to produce interference resonance absorbtion at the light wavelength of interest. The light enters the silicon through the sapphire and is reflected off the metal electrode to produce the interference at the silicon-sapphire interface. The diode produces absorption by causing the light to reflect back and forth in the silicon causing the absorption to occur in a small region. By reducing the active volume of silicon, there is a reduction of the photo-current response to ionizing radiation. It is also emphasized that by tuning the diode, it can be made insensitive to light of wavelength other than the wavelength of the signal reducing noise.

The effect of the diode is achieved by reflecting the light back and forth between the metal of the Schottky barrier and the silicon-sapphire interface. This occurs if the wavelength of the light in the silicon is 4, 4/3, 4/5, etc., the thickness of the silicon because of the different orders of the interference phenomenon. These interference phenomenon are the same as those produced by transmission coatings on camera lenses and also by very sharp interference light filters with band passes of 50 Å.

One purpose is to enhance the sensitivity of the detector to light without increasing the sensitivity to gamma and x-ray radiation. This will improve the signal to noise ratio in a radiation environment. The absorption length of red light is 25–100 um in silicon. Thus, one pass through 0.7 um of silicon converts only a small percentage of the light energy to electrical signal. This signal can be increased by trapping the light, reflecting it back and forth as happens at an interface absorption resonance. The device should display Newton's fringes, with a dark spot in the middle when tuned. The gamma and x-ray photons only make one pass through the detector, thus are not enhanced.

I claim:

1. A radiation dose rate hardened detector of light being comprised of a sapphire substrate of a preselected thickness and having first and second sides, a silicon island with first and second sides, said first side of said silicon island positioned on said first side of said sapphire substrate, said silicon island having the thickness thereof adjusted to produce interference resonance absorption at a predetermined wavelength, a metal electrode positioned on said second side of said silicon island, said metal electrode being composed of a metal that forms a Schottky diode on said silicon island, a first electrical contact connected to said metal electrode, and a second electrical contact connected to said silicon island, said light entering said detector from said second side of said sapphire substrate and reflecting back and forth in said silicon island causing said absorption to occur in a small region.

2. A radiation dose rate hardened detector of light as described in claim 1 wherein the thickness of said sapphire is in the region of 5 to 10 mils, and the thickness of said silicon island is in the region of 0.5 to 0.7 umeters.

3. A radiation dose rate hardened detector of light as described in claim 1 wherein said silicon is of the N type.

4. A radiation dose rate hardened detector of light as described in claim 1 wherein said silicon island is of the P type.

* * * * *